(12) United States Patent
Schnur

(10) Patent No.: US 8,258,903 B2
(45) Date of Patent: Sep. 4, 2012

(54) SUPERCONDUCTING, ACTIVELY SHIELDED MAGNET

(75) Inventor: Guenter Schnur, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 394 days.

(21) Appl. No.: 12/687,975

(22) Filed: Jan. 15, 2010

(65) Prior Publication Data

US 2010/0277263 A1 Nov. 4, 2010

(30) Foreign Application Priority Data

Jan. 16, 2009 (DE) .......................... 10 2009 004 899

(51) Int. Cl.
*H01F 1/00* (2006.01)
*H01F 7/00* (2006.01)
*H01F 6/00* (2006.01)

(52) U.S. Cl. ........ 335/216; 335/296; 335/299; 335/300; 335/301; 324/318; 324/319; 324/320

(58) Field of Classification Search ................... 335/216, 335/296, 297, 298, 299, 300, 301; 324/318, 324/319, 320
See application file for complete search history.

(56) References Cited

U.S. PATENT DOCUMENTS

| | | | |
|---|---|---|---|
| 4,587,504 A | 5/1986 | Brown et al. | |
| 5,012,217 A * | 4/1991 | Palkovich et al. | ............ 335/301 |
| 5,235,282 A * | 8/1993 | Overweg et al. | ............. 324/318 |
| 5,278,503 A | 1/1994 | Keller et al. | |
| 5,280,247 A * | 1/1994 | DeMeester et al. | ........... 324/318 |
| 5,329,266 A | 7/1994 | Soeldner et al. | |
| 5,426,366 A * | 6/1995 | Overweg et al. | ............. 324/319 |
| 6,507,259 B2 * | 1/2003 | Westphal et al. | ............. 335/301 |
| 7,098,663 B1 | 8/2006 | Hollis | |
| 7,170,291 B2 * | 1/2007 | Westphal | ...................... 324/319 |
| 7,414,401 B1 * | 8/2008 | Lvovsky | ...................... 324/318 |
| 2004/0021465 A1 | 2/2004 | Hollis | |
| 2005/0110491 A1 * | 5/2005 | Havens | ......................... 324/318 |
| 2007/0069730 A1 * | 3/2007 | Kimmlingen et al. | ........ 324/318 |
| 2007/0146107 A1 * | 6/2007 | Lvovsky et al. | .............. 335/296 |

* cited by examiner

*Primary Examiner* — Mohamad Musleh
(74) *Attorney, Agent, or Firm* — Schiff Hardin LLP

(57) ABSTRACT

A superconducting, actively shielded magnet has a first and second superconducting coil modules that generate a homogeneous magnetic field in a first direction in an operating volume of the magnet and that reduces the scatter magnetic field in an environment of the magnet. A third superconducting coil module is arranged in proximity to the first and second coil modules. The third coil module is fashioned to generate a compensation gradient field given occurrence of an interference gradient field in the environment so that the effect of the interference gradient field in the operating volume is reduced.

14 Claims, 3 Drawing Sheets

SUPERCONDUCTING, ACTIVELY SHIELDED MAGNET

BACKGROUND OF THE INVENTION

1. Field of the Invention

The present invention concerns a superconducting, actively shielded magnet of the type having first and second superconducting coil modules that generate a homogeneous magnetic field in a first direction in an operating volume of the magnet and the reduce the scatter magnetic field in an environment of the magnet.

2. Description of the Prior Art

In general, an actively shielded magnet is formed of two coil modules that are dimensioned and operated so that together they generate a strong magnetic field in the operating volume, and at the same time the scatter field in the environment of the magnet is significantly reduced.

Actively shielded superconducting magnets are widely used in medical magnetic resonance engineering. They are required in order to provide a strong and homogeneous magnetic field in the operating volume for polarization of specific atomic nuclei. Due to the high frequency of hydrogen in living tissue, polarized protons are excited to magnetic resonance in medical magnetic resonance engineering. After a processing of the magnetic resonance signals generated by the excited atomic nuclei, the received signals are reconstructed for an anatomical or functional imaging. Spectroscopic examinations are also implemented with the magnetic resonance technique, in which superconducting magnets are thereby likewise used for the polarization of atomic nuclei.

Cylindrical magnet designs are commonly used in medical magnetic resonance engineering. The first coil module generates a primary magnetic field in the operating volume while the second coil module generates a secondary magnetic field that strongly reduces—and, in the ideal case, should even compensated for—the scatter field generated in the environment of the magnet by the first coil module. The two coil modules are arranged coaxially, the second coil module (or shielding coil) surrounding the first coil module (or primary coil). The actual operating volume is located within the inner coil module. The two coil modules are electrically connected oppositely in series so that the magnetic fields generated by the two coil modules are aligned in opposition in the operating volume and in the environment. For example, a combination of the first coil module that generates a magnetic field of 2.25 Tesla in the operating volume, with a second coil module that generates a field of 0.75 Tesla in the operating volume, results in an effective magnetic field of 1.5 Tesla in the operating volume. Although the usable field strength in the operating volume is reduced by the active shielding, the reduction effect on the scatter field in the environment is greater. Such an actively shielded superconducting magnet is described in EP 0 144 171 A, for example.

This basic design of the actively shielded magnet has the disadvantage property that the intrinsic shielding effect against external magnetic interference fields in the operating volume is severely reduced in comparison to a superconducting magnet that is not actively shielded. The operating volume is thus no longer shielded against external magnetic interference fields.

To reestablish the shielding effect against external interference fields, additional electrically shorted shielding coils are used that are designated as an "External Interference Shield" or "EIS". They are fashioned and arranged so that they generate a homogeneous compensation field and—in interaction with the first and second coil modules—reduce the effect of external interference fields in the operating volume and simultaneously only slightly negatively affect the homogeneous magnetic field in the operating volume. The technology of such additional EIS shielding coils is described in detail in U.S. Pat. No. 5,329,266.

The additional shielding coils, however, have only a slight shielding effect against external magnetic interference fields from interference field generators in proximity to the magnet. Such interference fields are caused, for example, by automobiles and trucks driving past, or traveling building elevators. In practice, in this cases an additional magnetic shielding (for example made of transformer plates) conventionally must be provided.

SUMMARY OF THE INVENTION

An object of the present invention is to provide a superconducting, actively shielded magnet with shielding properties against external magnetic interference fields (in particular against interference fields that are generated in the environment of the magnet) that are improved in the operating volume.

The object is achieved in accordance with the invention by a superconducting, actively shielded magnet with first and second superconducting coil modules that generate a homogeneous magnetic field in a first direction in an operating volume of the magnet, and a third superconducting coil module arranged in proximity to the first and second coil module that reduces the scatter magnetic field in the environment. The third coil module is fashioned to generate a compensation gradient field given occurrence of an interference gradient field in the environment, so that the effect of the interference gradient field in the operating volume is reduced.

The invention is based on the recognition that interference fields generated in proximity to the magnet have a large field component with a spatial dependency on the field strength. This spatially dependent field component gradient is significantly reduced by shield coils that generate a spatially-dependent compensation gradient field in the operating volume. In this spatially independent field component there are, in turn, essentially linear, spatially independent portions that are compensated with correspondingly designed shield coils.

The magnetic field components in the direction of the primary magnetic field (thus in the first direction) have a large influence on the imaging. Components of interference fields in this first direction have a particularly disadvantageous effect on the imaging quality. The third coil module is accordingly designed to compensate for interference gradient fields with field components in the direction of the primary magnetic field (thus the first direction). Interference fields that particularly negatively affect the image quality are compensated in the operating volume. The structure requirements for an interference-free operation of the magnetic resonance apparatus are reduced and complicated auxiliary shielding measures can thus be avoided.

Oppositely conducting Helmholtz coil pairs, or Maxwell coil pairs, can advantageously be used for compensation of interference gradient fields with a gradient in the first direction. These are two identical coils with circular windings that are arranged symmetrically along the first direction with an interval that corresponds to $\sqrt{3}$ times the radius of the coils. The coils are electrically connected in series so that the same current (in terms of amount) flows through them but the direction of the currents in the two coils is opposite. Due to the symmetry of the arrangement, the even terms in the series expansion of the compensation gradient field are zero. Due to the specific interval, the $z^3$ term of the series expansion is also zero, such that the leading, non-constant term of the series expansion is of the $z^5$-th order.

To generate the compensation gradient fields with field gradients in additional directions perpendicular to the first direction, additional coil modules with saddle coil designs are used as they are also already used in magnetic resonance engineering in gradient coils for spatial coding of the magnetic resonance signals.

In the design and the arrangement of the coil modules in a magnetic resonance apparatus for generation of compensation gradient fields must be insured that they are decoupled from the gradient coils in the magnetic resonance apparatus that are provided for spatial coding. That can be ensured by the use of actively shielded gradient coils and/or a sufficient spatial separation of the coil modules from the gradient coils that are used for spatial coding of the magnetic resonance signals.

DESCRIPTION OF THE PREFERRED EMBODIMENTS

Figure 1:
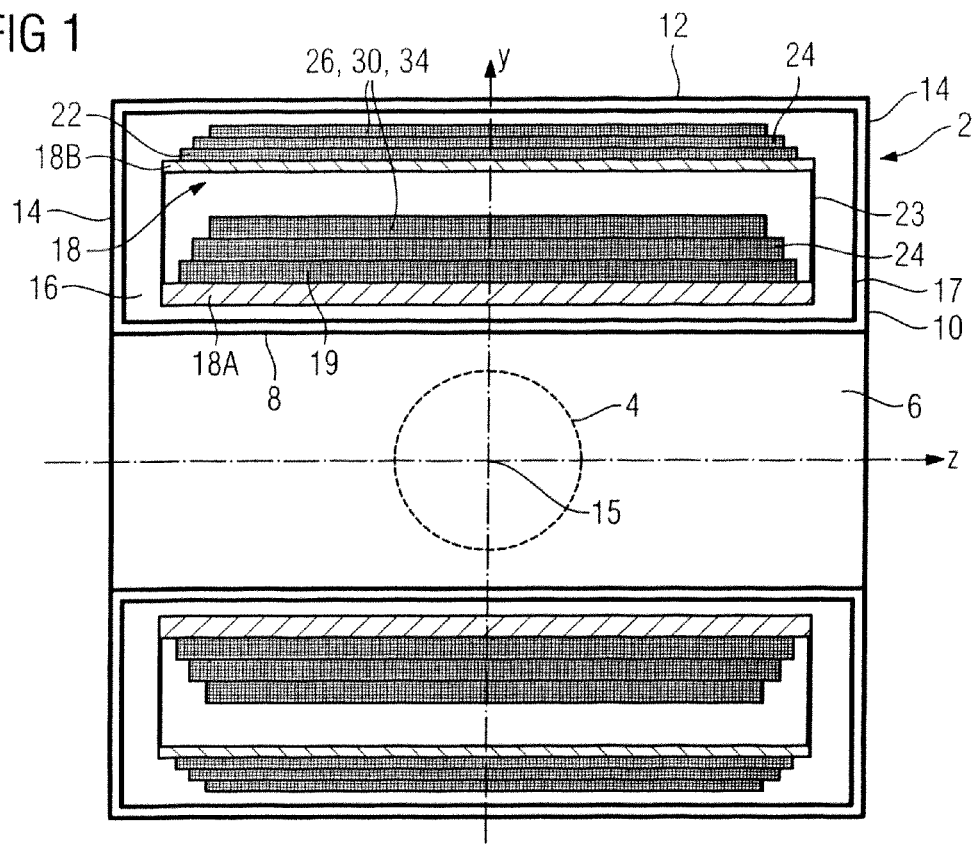
FIG. 1 shows, in section, an embodiment of coil modules for compensation of interference gradient fields in a superconducting, actively shielded magnet in accordance with the invention.

FIG. 1 illustrates, in section, the basic construction design of the different coil modules in an example of a superconducting, actively shielded magnet 2 for a medical magnetic resonance apparatus. An operating volume 4 of the magnetic resonance apparatus is located in a cylindrical bore 6 that is bounded by an inner wall 8 of a housing 10 of the magnet 2. The housing 10 is furthermore formed by an outer wall 12 arranged coaxial to the inner wall 8 and by circular ring-shaped front and rear walls 14 arranged on the facing sides. The magnet 2 is designed rotationally symmetrical relative to an axis, here the z-axis of a Cartesian coordinate system 15.

An inner space 16 formed by the walls 8, 12, 14 serves for the accommodation of various superconducting coil modules for the generation of the homogeneous magnetic field and to shield against external magnetic interference fields. The inner space 16 is filled with liquid helium to cool the coil modules. Radiant heat shields 17 prevent excessive heat absorption of the superconducting coil modules arranged in the helium bath.

A first superconducting coil module 19 is arranged on a first coil sub-carrier 18A. The first superconducting coil module 19 composed of multiple sub-coils that are wound in corresponding grooves of the coil sub-carrier 19A and are mechanically firmly fixed. A second superconducting coil module 22 is arranged on a second coil sub-carrier 18B arranged coaxial to the first coil sub-carrier 18A. The second coil sub-carrier 18B is supported by spacers 23 on the first coil sub-carrier 18A. The first and second coil sub-carriers 18A, 18B together with the spacers 23 form the coil carrier for the coil modules.

The second coil module 22 likewise is composed of multiple sub-coils that are wound in grooves of the second coil sub-carrier 18B and are mechanically firmly fixed. In typical designs of the first and second coil module, the first coil module 19 has a greater number of sub-coils than the second coil module 22.

The first superconducting coil module 19 is designated as a primary coil and generates a first homogeneous magnetic field in the operating volume 4. The second superconducting coil module 22 is designated as a secondary or shield coil and generates a second homogeneous magnetic field in the operating volume 4, that has a field direction opposite to the first homogeneous magnetic field. The second superconducting coil module 22 should significantly reduce the magnetic field generated by the first coil module 19 in the environment of the magnet 2. In order to generate a homogeneous magnetic field of 1.5 Tesla in the operating volume, for example, the first superconducting coil module is dimensioned so that it generates a magnetic field of 2.2 Tesla in the operating volume 4. In contrast to this, the second superconducting coil module 22 is dimensioned so that it generates a magnetic field of 0.7 Tesla in the opposite direction.

An additional superconducting coil module 24 is arranged on the first coil module 19. Parts of the additional coil module 24 can also be arranged on windings of the second coil module 22. The additional coil module 24 is dimensioned so that they compensate for interferences from the outside environment of the magnet in the operating volume 4. Interferences from the more remote environment predominantly exhibit homogeneous magnetic field components. The additional coil module is also designated as an "external interference shield" or "EIS".

To compensate for interferences from the surroundings of the magnet 2, a third coil module 26 is provided that is likewise arranged on windings of the first and second coil module 19 and 22. In contrast to interferences from the more remote environment, interferences from the surroundings of the magnet 2 predominantly has linear, spatially dependent components and additionally components of a higher order as well. The third coil module 26 is dimensioned so that an interference field present as a linear gradient field is compensated in the z-direction in the operating volume 4.

Figure 2:
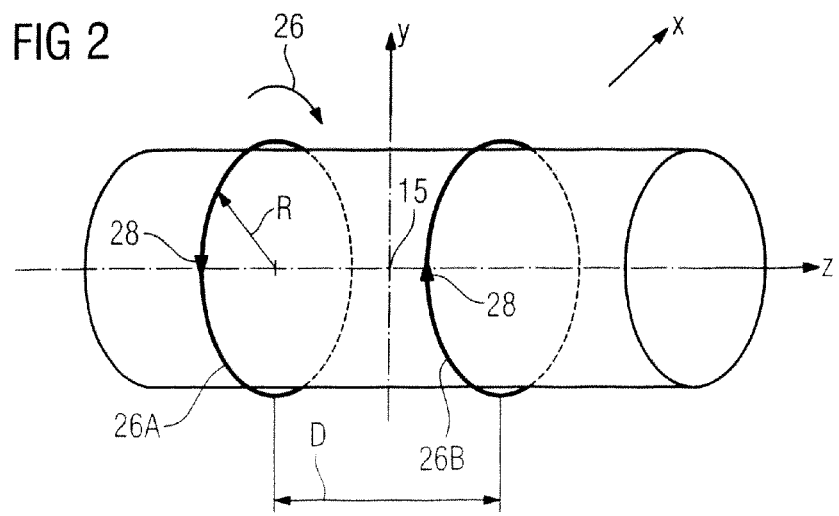
FIG. 2 schematically illustrates a basic arrangement of a coil module for compensation of external, linear interference gradient fields with interference field components in the z-direction, and with a linear spatial dependency of the field strength in the z-direction.
Figure 3:
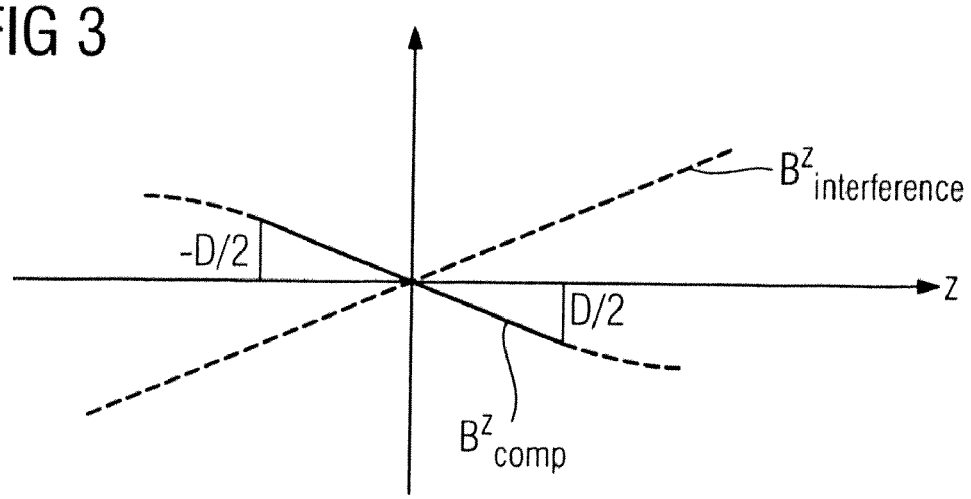
FIG. 3 is a depiction of the curve of an interference gradient field and a compensation gradient field in the operating volume of the magnet.

FIG. 2 shows an embodiment of the third coil module 26 for compensation of linear interference fields with a gradient field in the z-direction. The third coil module 26 here is formed by a Maxwell or anti-Helmholtz magnetic coil pair with two coils 26A and 26B that are electrically connected antiparallel in series. Arrows 28 symbolize the current flow directions in the antiparallel series circuit. The distance D of the two coils 26A and 26B amounts to $\sqrt{3}$ times its radius R.

The third coil module 26 generates a spatially linear field distribution of the field components in the z-direction in its center of symmetry and, approximately, also in the operating volume 4. This is illustrated qualitatively for the current directions shown in FIG. 2. The compensation gradient field $B^z_{comp}$ generated by the third coil module 26 compensates in the operating volume 4 an external interference gradient field $B^z_{interference}$ with opposite operational sign.

Figure 4:
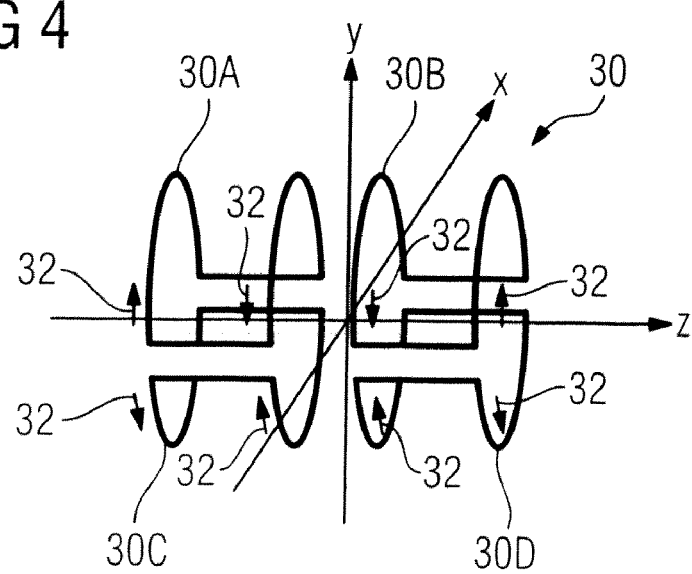
FIG. 4 schematically illustrates an embodiment with a fourth coil module.

FIG. 4 shows schematically, in perspective view, the design of a fourth superconducting coil module 30 for compensation of linear interference fields with a gradient field in the y-direction. The fourth coil module 30 consists of four saddle coils 30A, 30B, 30C and 30D. The saddle coils 30A through 30D are arranged symmetrically relative to the coordinate origin and are electrically connected in series so that the current directions indicated by arrows 32 result. A gradient field which generates in the operating volume 4 a component in the positive z-direction given positive y-values and a component in the negative z-direction given negative y-values results with these current directions.

By rotation of the fourth coil module 30 by 90° around the z-axis, a fifth superconducting coil module 34 (schematically indicated in FIG. 1) results with which linear interference fields in the x-direction can be corrected.

The conductors of the third coil module 26, the fourth coil module 30 and the fifth coil module 34 are wound on the first coil sub-carrier 18A and the second coil sub-carrier 18B in addition to the conductors of the first coil module 19, the second coil module 22 and the additional coil module 24.

Figure 5:
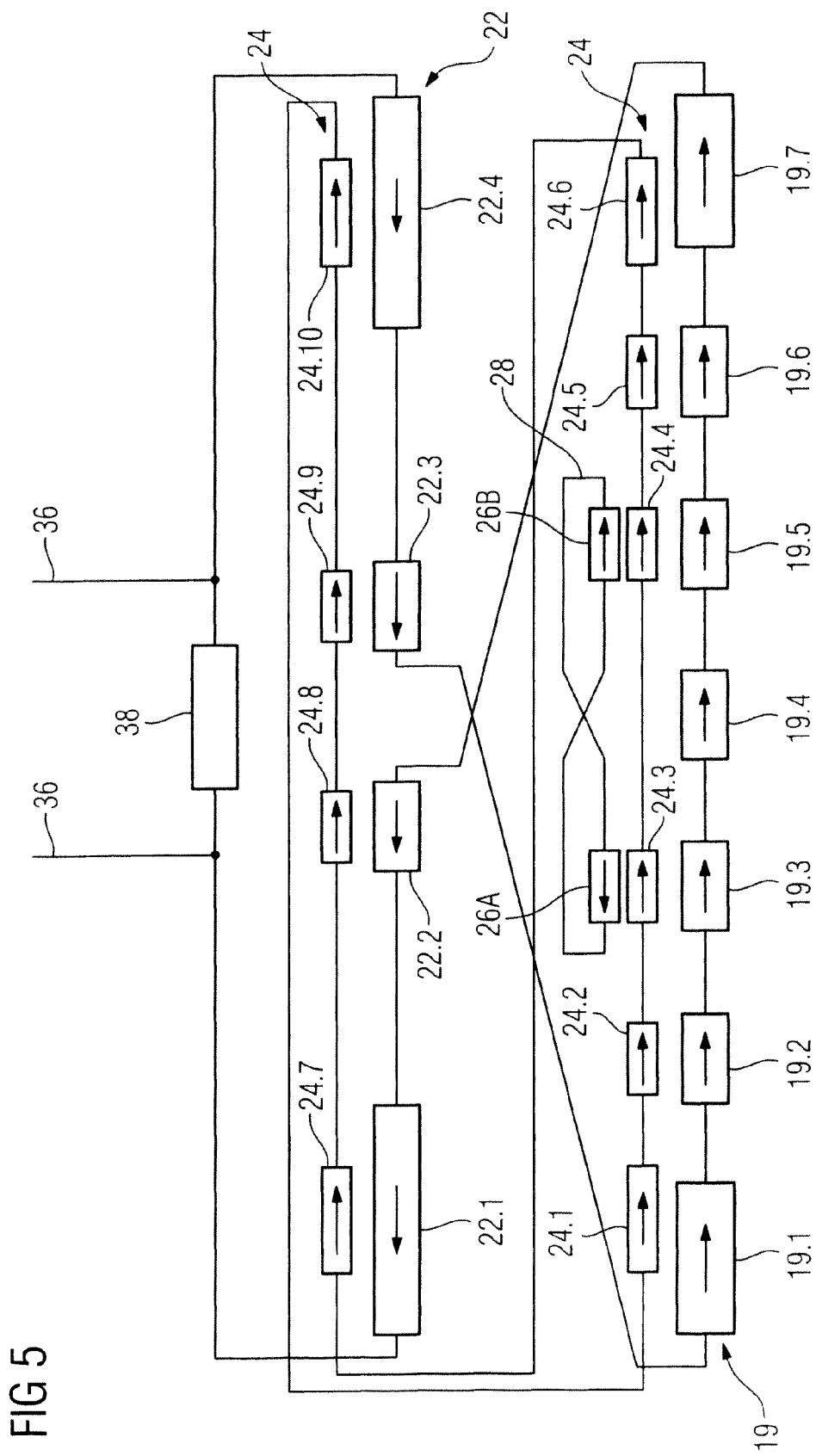
FIG. 5 is a block diagram of an electrical circuit of a superconducting, actively shielded magnet with shield coils for generating homogeneous field and for compensating spatially dependent external magnetic interference fields with a gradient in the z-direction.

FIG. 5 shows the electrical circuit of the first and second coil module 19 or, respectively, 22, the additional coil module 24 and the third coil module 26. The first coil module 19 here is formed of seven individual coils 19.1 through 19.7. The second coil module 22 is formed of four coils 22.1 through 22.4. The additional coil module 24 is arranged on the individual coils of the first and second coil modules 19 and 22 and is composed of ten individual coils 24.1 through 24.10. The coils 26A and 26B of the third coil module 26 are wound on the already present windings on the first coil sub-carrier 18A. The arrows in the individual coils 19.1 through 19.7, 22.1 through 22.4 and 24.1 through 24.10 as well as 26A and 26B indicate the current directions (and therefore the electrical interconnection) of the coils of the individual coil modules. It can be seen that the coils of the third coil module 26 are connected in the opposite direction for the generation of the compensation gradient fields $B^z_{comp}$ while the coils of the coil modules 19, 22 and 24 are connected in series in the same direction.

Additional electrical connections 36 and switches and safety devices 38 for raising and lowering the magnetic field strength in the operating volume 4 are also indicated in FIG. 5.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. A superconducting, actively shielded magnet, comprising: a housing filled with a cryogen, said housing being located with respect to a center of symmetry; a first superconducting coil module in said housing that generates a homogenous magnetic field in a homogenous magnetic field direction in a volume outside of said housing and enclosed by said first superconducting coil module; a second superconducting coil module in said housing surrounding said first superconducting coil module, that generates a reducing magnetic field that reduces a scatter magnetic field in an environment that encompasses said first and second superconducting coil modules; and a third superconducting coil module located in said housing relative to said first and second superconducting coil modules, that generates a compensation gradient field that substantially compensates an interference gradient field at least in said volume to substantially reduce an effect of said interference gradient field in said volume.

2. A superconducting, actively shielded magnet as claimed in claim 1 wherein said third superconducting coil module generates a magnetic field in said homogenous magnetic field direction, with said compensation gradient field in said homogenous magnetic field direction.

3. A superconducting, actively shielded magnet as claimed in claim 1 wherein said third superconducting coil module is electrically shorted.

4. A superconducting, actively shielded magnet as claimed in claim 1 wherein said third superconducting coil module comprises two coil sub-modules electrically connected in series.

5. A superconducting, actively shielded magnet as claimed in claim 4 wherein one of said two coil sub-modules generates a magnetic field in said homogenous magnetic field direction, and wherein the other of said two coil sub-modules generates a magnetic field in a direction opposite to said homogenous magnetic field direction.

6. A superconducting, actively shielded magnet as claimed in claim 5 wherein said two coil sub-modules are a Maxwell coil pair.

7. A superconducting, actively shielded magnet as claimed in claim 1 comprising a fourth superconducting coil module located in said housing in proximity to said first and second superconducting coil modules that generates a compensating magnetic field component in said homogenous magnetic field direction and that generates a gradient magnetic field in another direction, substantially perpendicular to said homogenous magnetic field direction.

8. A superconducting, actively shielded magnet as claimed in claim 7 comprising a fifth superconducting coil module located in said housing in proximity to said first and second superconducting coil modules, that generates a further magnetic field component in said homogenous magnetic field direction, and another magnetic field gradient in a direction substantially perpendicular to both said homogenous magnetic field direction and said further direction of said magnetic field gradient generated by said fourth superconducting coil module.

9. A superconducting, actively shielded magnet as claimed in claim 8 wherein said fifth superconducting coil module is comprised of saddle coils.

10. A superconducting, actively shielded magnet as claimed in claim 8 wherein each of said fourth superconducting coil module and said fifth superconducting coil module is comprised of saddle coils.

11. A superconducting, actively shielded magnet as claimed in claim 8 comprising a coil carrier on which said first and second superconducting coil modules are mounted in said housing, and on which at least one of said third superconducting coil module, said fourth superconducting coil module and said fifth superconducting coil module is also mounted.

12. A superconducting, actively shielded magnet as claimed in claim 11 wherein said coil carrier comprises an inner, cylindrical sub-carrier and an outer, cylindrical sub-carrier coaxial to said inner, cylindrical sub-carrier, and wherein said first superconducting coil arrangement is mounted on said inner, cylindrical sub-carrier and said second superconducting coil arrangement is mounted on said outer, cylindrical sub-carrier.

13. A superconducting, actively shielded magnet as claimed in claim 7 wherein said fourth superconducting coil module is comprised of saddle coils.

14. A superconducting, actively shielded magnet, comprising:
- a housing filled with a cryogen, said housing being located with respect to a center of symmetry;
- a first superconducting coil module in said housing that generates a homogenous magnetic field in a homogenous magnetic field direction in a volume within said first superconducting coil module;
- a second superconducting coil module in said housing surrounding said first superconducting coil module, that generates a reducing magnetic field that reduces a scatter magnetic field in an environment of said first and second superconducting coil modules;
- a third superconducting coil module located in said housing relative to said first and second superconducting coil modules, that generates a compensation gradient field that substantially compensates an interference gradient field in said environment to substantially reduce an effect of said interference gradient field in said volume; and
- said third superconducting coil module being electrically shorted and comprising two coil sub-modules electrically connected in series, one of said two coil sub-modules generating a magnetic field in said homogenous magnetic field direction, and the other of said two coil sub-modules generating a magnetic field in a direction opposite to said homogenous magnetic field direction, and said two coil sub-modules being symmetrically located with respect to said center of symmetry.

* * * * *